United States Patent [19]

Leon

[11] Patent Number: 4,897,652
[45] Date of Patent: Jan. 30, 1990

[54] METHOD OF CODING NUMBERS IN BINARY FORM

[75] Inventor: Rémi Leon, Coatreven, France

[73] Assignee: Alcatel Cit, Paris, France

[21] Appl. No.: 174,470

[22] Filed: Mar. 28, 1988

[30] Foreign Application Priority Data

Mar. 27, 1987 [FR] France .................................. 87 04278

[51] Int. Cl.$^4$ ............................................. H03M 7/34
[52] U.S. Cl. ........................................ 341/51; 341/73; 341/75
[58] Field of Search ................... 341/51, 53, 55, 73, 341/75

[56] References Cited

U.S. PATENT DOCUMENTS

| | | |
|---|---|---|
| 3,594,560 | 7/1971 | Stanley .................................. 341/75 |
| 3,742,198 | 6/1973 | Morris . | 
| 3,825,924 | 7/1974 | Montgomery ........................ 341/75 |
| 4,617,641 | 10/1986 | Hamada . |

Primary Examiner—William M. Shoop, Jr.
Assistant Examiner—Gary J. Romano
Attorney, Agent, or Firm—Sughrue, Mion, Zinn, Macpeak & Seas

[57] ABSTRACT

A coding method uses a pseudo-logarithmic compression law approximated by a straight line segment curve. Its code word on n+1 binary digits, where n is a positive invariant integer, has a lefthand part made up of a variable number p of binary digits having the same value (1) corresponding to the rank number of the segment concerned in the compression law and a righthand part, which may be absent, determining the interval within the segment concerned. It may be implemented on the basis of a series of counting pulses defining the number to be coded by means of a circuit which comprises a divider circuit having a plurality of division ratios operating on the series of counting pulses, a synchronization circuit which also selects the division ratio of the divider circuit corresponding to the increment between intervals in the segment concerned of the compression law, and a counting circuit operating on the series of pulses delivered by the divider circuit and supplying on parallel outputs the value of the code word corresponding to the number of counting pulses applied to the input of the divider circuit.

5 Claims, 2 Drawing Sheets

METHOD OF CODING NUMBERS IN BINARY FORM

BACKGROUND OF THE INVENTION

1. Field of the Invention

The present invention concerns coding numbers in binary form using a pseudo-logarithmic compression law providing, for the same number of binary digits in the code word, a coding range (that is to say, a set of codable number values) that is more extensive than natural binary at the cost of reduced accuracy, which is no longer one hundred percent, the same code word value being assignable to several neighboring number values.

2. Description of the Prior Art

The best known binary codes of this kind are the so-called A law and $\mu$ law PCM codes defined in CCITT Recommendation G.711 which utilize a logarithmic compression law approximated by curves comprising 16 straight line segments with slope ratio equal to 2. Their eight-digit code words comprise three distinct parts, from left to right:

- a sign - determining first part consisting of a sign bit,
- a segment - determining second part consisting of three binary digits serving in combination to identify one of eight segments, and
- a third part determining the interval within the segment, consisting of four binary digits serving to determine the interval concerned within the segment.

The A and $\mu$ laws follow compression laws for which all segments except the first two comprise 16 intervals the amplitude of which doubles from segment to segment. Law A has coincident first and second segments with 32 intervals of amplitude 2 which gives a coding range running from $-4\,095$ through $+4\,095$ and a maximal coding error, outside the first segment, running from 4.7% for the second segment through 6.2% for the last segment. The law $\mu$ has a first segment with 16 intervals of amplitude 2 except for the first which has amplitude 1 and a second segment of 16 intervals of amplitude 4, which gives it a coding range extending from $-8\,158$ through $+8\,158$ and a maximal coding error, outside the first segment, running from 9.7% for the second segment through 6.3% for the last segment.

These A law and $\mu$ law PCM codes are well suited to digital coding of speech but have disadvantages in other applications such as the transmission of error rates in equipment distributed along a digital transmission link. These error rates, which are expressed as numbers of errors detected per surveillance cycle, occupy a wider range than the coding range of the A law and $\mu$ law PCM codes, even if modified given the lack of need for the sign bit, and necessitate a non-uniform accuracy of coding, high at the bottom end of the range and just sufficient at the top end of the range to indicate the orders of magnitude of high error rate values. It is important to have a high accuracy of coding for a low value error rate which may occur when the link is in a functioning state in order to be able to identify from a supervised terminal isolated, regular or random errors and to monitor the quality of functioning of equipment distributed along the link sufficient accurately to establish a maintenance program with preventive servicing to avoid interruptions of traffic, while knowing the order of magnitude concerned or that a range overshoot has occurred in the case of high error rates facilitates identification of the faulty equipment.

It is possible to enhance the accuracy of the A law and $\mu$ law PCM codes by doubling the number values before coding them. This introduces a first subrange (0-31 for the A law) in which the coding accuracy is total but at the cost of reducing the total coding range by one half (0-2 047 for the A law), this range being already insufficient in the aforementioned applications.

In these aforementioned applications it is also important that coding be easy to implement using counters, the number of errors detected per surveillance cycle which constitutes the error rate being originally available in the form of counting pulses.

One object of the present invention is a method of coding numbers in binary form using a pseudologarithmic compression law which has enhanced characteristics as compared with the A law and $\mu$ law PCM codes both with regard to the accuracy at the bottom end of the range and the total extent of the coding range, and which is well suited to transmission of error rates of equipment distributed along a digital transmission link.

Another object of the invention is a method of coding numbers in binary form using a pseudo-logarithmic compression law which can be implemented on the basis of numbers available as counting pulses using a simple and reliable counting device that can form part of an equipment that is relatively inaccessible, as is generally the case with the equipment distributed along a digital transmission link.

SUMMARY OF THE INVENTION

In one aspect, the present invention consists in a method of coding numbers in binary form using a pseudo-logarithmic compression law approximated by a curve made up of straight line segments, the method consisting in coding an unsigned number in the form of a code word comprising $n+1$ binary digits where n is an invariant positive integer, said code word comprising a lefthand part determining the corresponding segment of the compression law curve and a righthand part determining the interval within the segment concerned, in which method:

said lefthand part of the code word is made up of a variable number p of binary digits of the same value (hereinafter called 1), the number p corresponding to the rank number of the compression law curve segment concerned as counted from the origin and chosen as equal to the leftward shift, relative to the position of the most significant bit of the code word, of the most significant bit of the number to be coded, expressed in natural binary and augmented by $2^n$, and, said righthand part of the code word, when present, is made up of a binary number having at the position of the most significant bit a separator bit the value of which (hereinafter called 0) is the complement of that of the said p binary digits of said lefthand part and corresponds to the expression in natural binary of the number to be coded augmented by $2^n$ and then truncated on the right by 2p digits and deprived of its most significant bit.

In another aspect, the present invention consists in a device for coding in binary form numbers provided in the form of a series of counting pulses using a pseudologarithmic compression law approximated by a curve made up of straight line segments by a method as defined in the preceding paragraph, said device comprising:
- a divider circuit with a plurality of division ratios operating on said series of counting pulses and having one output corresponding to a division ratio of $2^n$ and another output corresponding to a variable division ratio selected from powers of 4 corresponding to the rank numbers of the segments of the compression law as counted from the origin, the first segment having the rank number 0,
- a synchronization and selector circuit which determines, by counting packets of $2^n$ counting pulses sent by the divider circuit and by registering when the number of said packets crosses a threshold $2^i-1$ where i is an integer between 1 and n, when lower thresholds of subranges corresponding to the segments of the compression law curve with rank number i are crossed and which commands said divider circuit to select the division ratio corresponding to the ith power of 4 and which resynchronizes said divider circuit after a subrange lower threshold has been crossed, and
- an n+1 stage counter circuit adapted to count pulses delivered by the variable division ratio output of said divider circuit and to yield a count which gives the value of the code word corresponding to the number of counting pulses applied to said divider circuit.

This coding method codes with total accuracy a first subrange from 0 through $2^n-1$ which corresponds (for a word of seven digits comparable in size with the A law or μ law PCM code minus the sign bit) to a subrange from 0 through 63 which is twice that obtained with an unsigned A law PCM code applied to numbers whose values are doubled before coding. The total coding range, from 0 through $2^n=1-2^n$ corresponds for a 7-digit code word to a range from 0 through 8 128 which is also significantly wider than that (from 0 through 2 047) for an unsigned A law PCM code applied to numbers whose values are doubled before coding.

This coding method is in accordance with a pseudo-logarithmic compression law with straight line segments corresponding to distinct coding subranges the extents of which double on passing from a lower subrange to a higher subrange and having successive slope ratios equal to ¼. It is remarkable on the one hand in having subranges which each have a number of intervals equal to a power of 2, which makes makes it possible for a counter running through them with one interval as its counting increment to have its least significant digits naturally reset to 0 on crossing a threshold between two subranges, and on the other hand in having a code word lefthand part defined in such a way that it can easily be modified on passing between two subranges by adding to it the overflow digit of a counter running through the segments with one interval as its counting increment. This feature makes it possible to obtain the code word as a whole using a binary counter driven by counting pulses defining the number to be coded, through the intermediary of a binary divider with division ratios that are multiples of 4 corresponding to the increments between intervals of the different segments of the compression law, properly synchronized and having the division ratio changed on crossing the thresholds between subranges.

Other advantages and characteristics of the invention will emerge from the following description of one embodiment thereof given by way of non-limiting example only and with reference to the appended diagrammatic drawings.

DESCRIPTION OF THE PREFERRED EMBODIMENT

Figure 1:
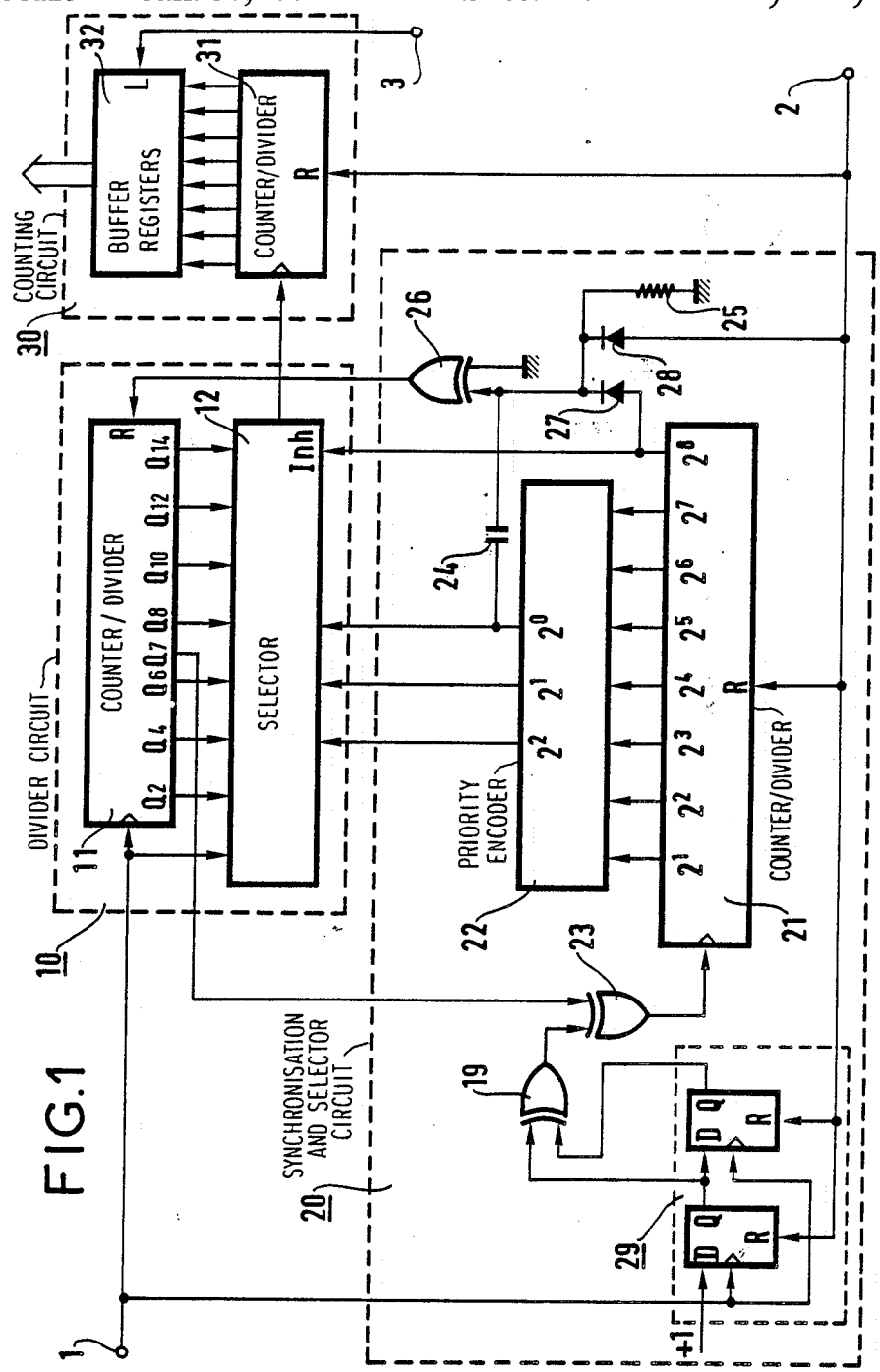
FIG. 1 shows a counting circuit implementing the coding method in accordance with the invention.

The object of a binary coding method using a pseudo-logarithmic compression law is to express in the form of a binary code word a series of numbers covering a wider range than is permitted by the various possible states of the code word. This is achieved by assigning to certain states of the code word several consecutive values of the number to be coded whilst attempting to retain the best possible accuracy when decoding. One way of proceeding is to express the number to be coded in natural binary and to truncate it sufficiently at the least significant digit end to reduce it to the length authorized by the code word. As the degree of truncation that will be needed will vary, it becomes necessary to reserve a place in the code word to identify the amount of truncation, which commensurately reduces the room remaining for the truncated number and limits the coding range because it is only possible to identify in the code word a limited number of truncation amounts.

The A law PCM code applied without inverting even-numbered bits to previously doubled unsigned numbers uses this method since its code word, which is formed by seven bits not including the sign bit, is divided into a lefthand part on three binary digits which serves to identify one of eight segments in the positive or negative part of the compression law and which codes in natural binary the position beyond the fourth digit of the first meaningful bit of the number to be coded expressed in natural binary and a righthand part on four binary digits which serves to identify the interval within the segment concerned and which is made up of the four most significant bits after the first meaningful bit or, by default, the four least significant bits of the number to be coded expressed in natural binary.

Thus the number 1 025, which is expressed 100 0000 0001 in natural binary, has its first meaningful bit beyond the fourth digit in the seventh position, which gives a code word lefthand part of 111, and 0000 as the four most significant bits after the most significant bit, which gives the code word 111 0000.

The number 15, which is expressed 1111 in natural binary, has a first meaningful bit which is not beyond the fourth digit, which gives a code word lefthand part of 000 and, since it does not have four bits after the most significant bit, its four bits are repeated in the code word, which is 000 1111.

This technique, derived from the A law, provides for truncating by up to seven digits which limits the coding range to the numbers whose values are expressed in natural binary on 12 digits maximum (seven for truncation, then the four bits taken into the code word and finally the most significant bit) which gives a coding range from 0 through 2 047. The subrange from 0 through 31 is coded without truncation and with total accuracy and the other subranges are coded with the amount of truncation increasing by one digit on passing from one subrange to the next.

To increase the width of the first subrange which is coded with total accuracy, it is necessary to increase the room provided in the code word for expressing the truncated number, which can only be done to the detriment of the room reserved for identifying the amount of truncation. With the coding method deduced from the A law which has just been described, this amounts to an excessive restriction on the number of possible truncation amounts and consequently the extent of the coding range.

To overcome this problem it is proposed to reserve in the code word, for identifying the amount of truncation, a space of variable length directly proportional to the amount of truncation, identifying the latter in terms of the length of a series of bits of the same value (taken as 1 in the examples to be described) and recognizing this sequence in the left hand part of the code word by means of a separator bit which has the complemented value (taken as 0 in the examples to be described) and which is always present when the right-hand part exists.

The presence of the separator bit raises two problems: the space that it occupies in the code word to the detriment of the part reserved for the expression of the number, truncated or not, and the necessity for it to be systematically present in the code word where this does not consist of the lefthand part alone.

To recover the space that it occupies, it is assumed that when the number to be coded is truncated the separator bit represents, apart from inversion, the constant value of the most significant bit of the truncated number, which ensures that it is present when the truncated part of the number appears in the code word, i.e. when the number to be coded does not belong to the ranges of values each delimited at the lower end by an inclusive value that is a multiple (by a factor which is one less than a particular power of 2) of the binary weight of the most significant digit position of the code word and delimited at the upper end by a non-inclusive value that is a multiple (by a factor which is equal to the aforementioned power of 2) of the same binary weight.

For it to be possible to extend this convention to numbers belonging to these ranges and also to non-truncated numbers for which the separator bit is the leftmost bit in the code word, there is systematically added to every number to be coded the binary weight of the most significant digit position of the code word and the converse operation is carried out during decoding.

With the preceding convention, the number to be truncated to determine the righthand part of the code word is the number to be coded augmented by the value of the binary weight of the highest digit position of the code word. Truncation is required as soon as the position of the most significant digit of this number exceeds the capacity of the code word and has to be renewed with an increased amplitude each time that this position of the most significant digit shifts towards the left. This must be done in minimum steps of two digits, one of the digits serving to eliminate overshoot due to a leftward shift of the most significant binary digit and the other digit accounting for the reduction by one digit of the righthand part of the code word reserved for the result of truncation as each increase in the amount of truncation is identified by an extra digit in the sequence constituting the lefthand part of the code word.

The fixed length code word finally obtained comprises two parts the relative sizes of which vary according to the value of the number to be coded: a lefthand part identifying the amount of truncation, in other words the coding subrange that applies, and a righthand part containing the result of this truncation, in other words the actual position of the number to be coded in the subrange concerned.

The lefthand part of the code word is a series of binary digits having the value 1 and the number of which corresponds to the leftward shift, relative to the most significant digit position of the code word, of the most significant digit of the binary number resulting from adding to the number to be coded expressed in binary the weight of the most significant bit position of the code word, the number of bits of this sequence being also identifiable with the excess weight expressed as a power of two and relative to the most significant digit position of the code word of the binary number resulting from addition of the number to be coded and the weight of the most significant digit position of the code word.

The righthand part of the code word is formed by the binary number which results from adding to the number to be coded the weight of the most significant digit position of the code word, the most significant digit of which has been complemented, that is to say converted to 0, and which has been truncated on the right by a number of digits which is twice that in the lefthand part of the code word.

The lefthand part of the code word may not exist or may have any length up to that which completely occupies the code word. When it does not exist no truncation is applied and the number to be coded expressed in natural binary is repeated identically in the code word, since the operations of adding the weight of the most significant position of the code word and of complementing the most significant digit of the result cancel each other out. When it occupies all of the code word, the maximal value of the coding range is attained.

The various amounts of truncation identified by the number of digits in the lefthand part of the code word correspond to various coding subranges coincident with the segments of the logarithmic compression law. The extent of a coding subrange doubles on each passage from a lower subrange to a higher subrange while the increment that applies to it, that is to say at the end of which the value of the code word changes, quadruples since the truncation, as already defined, has a constant amplitude except for a leftward shift, beyond the most significant digit position of the code word, of the most significant digit of the binary number resulting from adding a constant to the number to be coded where this amplitude is augmented by two binary digits. This with a code word on $n+1$ digits, a lefthand part on $p$ digits corresponds to a coding subrange extending from $2^n(2^p-1)$ through $2^n(2^{p+1}-1)-1$ for which the increment is $4^p$.

The quadrupling of the increment on passing from a lower coding subrange to a higher coding subrange corresponds to slope ratios of $\frac{1}{4}$ for the segments of the pseudo-logarithmic compression law.

The increment increasing faster than the extent of the subranges results, on going from a lower subrange to a higher subrange, in an advance in the maximal coding error; using the previous notation this is expressed by the relationship:

$$\frac{(4^p - 1) \times 100}{2^n(2^p - 1)} \text{ with } p \neq 0 \text{ and } 0 \text{ for } p = 0$$

From a null value in the first subrange (p=0), it tends towards 100% in the (n+1)th subrange (p=n), the subrange corresponding to p=n+1 having no upper limit and having a lower limit which serves as a limit to the coding range.

For a code word on seven bits, comparable in size with the A law PCM code word, the coding method that has just been described provides a coding range extending from 0 through 8 128 with a first subrange from 0 through 63 coded with total accuracy, which represents significantly enhanced performance as compared with coding derived from the A law PCM code applied to unsigned binary number values that are doubled before coding, for which the coding range extends from 0 through 2 047 with a first total accuracy subrange from 0 through 31.

Implementation of the coding method, that is to say determination of the code word from the number to be coded, is based on a succession of elementary operations on binary numbers depending on the definition of the code word. These can be performed by a microprocessor or equally well using counters, as will be seen later.

To determine the value of a code word on n+1 digits corresponding to a binary number x in the coding range it is necessary, given the definition of the code word, to:
  adopt a null code word,
  add the value $2^n$ expressed in binary to the number x to be coded,
  use bit tests to find the position of the most significant bit of the sum obtained,
  identify the shift of this position relative to the most significant digit position of the code word,
  set to 1 in the code word, beginning from the most significant digit position, a number of consecutive bits corresponding to the relative shift value found, which constitutes the writing of the lefthand part of the code word,
  take the sum obtained in this way, change to 0 its most significant binary digit and shift it towards the right by a number of digits that is twice the previous relative shift value, the resulting number constituting the righthand part of the code word, and
  add the resulting number to the code word to obtain its final value.

Implementation of the decoding method, that is to say determination of the number corresponding to a particular value of the code word, also results from a succession of elementary operations on binary numbers depending on the definition of the code word and preformable by a microprocessor.

To determine the value of a binary number x from a code word on n+1 digits it is necessary, because of how the code word is defined, to:
  use bit tests to identify the most significant position in the code word occupied by a 0 digit,
  identify the shift of this position relative to the most significant digit position of the code word,
  set this most significant position occupied by a 0 digit to 1 and set all positions situated to its left to 0,
  shift the number obtained to the left by twice the preceding relative shift value, and
  subtract the value $2^n$ from the number obtained.

For a better understanding of the coding method we will now return, using a code word on seven bits, to the examples using the values 1 025 and 15 already employed in the context of the code derived from the A law PCM code.

The number 1 025 is expressed 100 0000 0001 in natural binary. To code it we begin by adding to it $2^{7-1}$, that is 100 0000. It becomes 100 0100 0001. Its most significant binary digit being in the fourth position to the left beyond the seventh digit which is the most significant position of the code word, the lefthand part of the code word will be 1111 and the truncation will be on eight digits, so that the sum is restricted to 100. The righthand part of the code word is deduced from this truncation by inverting the most significant binary digit and becomes 000, which yields the code word 111 1000.

The number 15 is expressed 1111 in natural binary. To code it $2^{7-1}$ is added to it and it becomes 100 1111. The most significant digit of this sum being in the position of the most significant digit of the code word, the sum is not truncated. The lefthand part of the code word does not exist and the righthand part is deduced from the sum obtained by inverting the most significant binary digit, which yields a code word 000 1111 including the binary expression of the original number to be coded.

To decode the code word 111 1000 previously obtained, it is necessary to identify the separator bit, which is the first 0 bit from the left, to distinguish the lefthand part 1111 and the righthand part 000 of the code word. Complementing the separator bit in the righthand part of the code word gives the number 100 which must be completed on the right with the eight digits truncated (since the lefthand part is on four digits) and gives the number: 100 0000 0000 from which the value $2^{7-1}$ (100 0000) is subtracted to yield 11 1100 0000 corresponding in natural binary to the value 960. This decoded number value is different from the initial value of 1 205 used for coding since in this coding subrange the accuracy of coding is not 100% and coding is subject to a maximal error which is, from equation (1):

$$\frac{(4^4 - 1) \times 100}{2^{7-1}(2^4 - 1)} = 26.5\%$$

The code word 000 1111 obtained in the second coding example is decoded in the same way. As the most significant binary position is at 0, this is the separator bit. The lefthand part of the code word does not exist, reflecting the fact that there has not been any truncation. After complementing the separator bit the righthand part of the code word becomes 100 1111. No digits need to be added on the right since there has not been any truncation and thus only the value $2^{7-1}$ (100 0000) is subtracted from it, giving the number 000 1111 corresponding in natural binary to the value used initially for coding, since this is in the first subrange where the coding accuracy is 100%.

The previously used definition of the code word may be expressed in the form of equations.

Let n+1 be the number of digits in the code word, to which are assigned from right to left the weights $2^0$ through $2^n$, let x(p) be a binary number to be coded which, added to $2^n$, has a most significant digit of weight $2^{n+p}$, and let M(x(p)) be the corresponding code word with its lefthand part y(p) and its righthand part z(x(p)). The number $[x(p)+2^n]$ will be truncated by 2p digits on the right which corresponds to a lefthand part of the code word having p bits with the value 1 expressed by the equation:

$$y(p) = 2^{n-p+1}(2^p - 1) \tag{2}$$

and a righthand part expressed as a function of the number to be coded x(p); added to $2^{n-p}$, it is equivalent to truncating the number to be coded x(p) augmented by $2^n$:

$$\text{Int}\left[\frac{x(p) + 2^n}{4^p}\right] = z[x(p)] + 2^{n-p} \text{ with } z[x(p)] < 2^{n-p} \quad (3)$$

in which Int is the integer part, whence:

$$M[x(p)] = 2^{n-p+1}(2^p - 1) + \text{Int}\left[\frac{x(p) + 2^n(1 - 2^p)}{4^p}\right]$$

Each value of p defines a coding subrange. The initial value of the subrange is denoted x0 (p) and the corresponding code word which has a null righthand part is denoted M0 (p):

$$M0(p) = 2^{n-p+1}(2^p - 1)$$

$$z[x0(p)] = \text{Int}\left[\frac{x0(p) + 2^n(1 - 2^p)}{4^p}\right] = 0$$

The smallest number for which the function Int $$x0(p) = 2^n(2^p - 1) \quad (4)$$

Whence:

$$M[x(p)] = M0(p) + \text{Int}\left[\frac{x(p) - x0(p)}{4^p}\right] \quad (5)$$

This last equation shows that within the same subrange it is possible to obtain a code word by counting and dividing down by $4^p$ the number of units separating the number to be coded x(p) from the initial value x0(p) of the subrange in question.

Note then that crossing the maximal value of a subrange p makes it possible to update both parts of the code word.

The maximum of the subrange (p) is reached with the largest number x1(p) for which the righthand part of the code word takes the value $2^{n-p} - 1$.

$$z[x1(p)] = 2^{n-p} - 1 = \text{Int}\left[\frac{x1(p) + 2^n(1 - 2^p)}{4^p}\right]$$

The largest number satisfying this equation is that which gives the largest remainder on dividing by $4^p$, whence:

$$(2^{n-p} - 1) 4^p + 4^p - 1 = x1(p) + 2^n(1 - 2^p)$$

$$x1(p) = 2^n(2^{p+1} - 1) - 1$$

Comparison with equation (4) shows that the next number is the smallest number x0(p+1) of the higher subrange (p+1). If, instead of going to the higher subrange, we continue to code the next digit x2(p) in the lower subrange, we obtain:

$$x2(p) = 2^n(2^{p+1} - 1)$$

-continued $$z[x2(p)] = \text{Int}\left[\frac{2^n(2^{p+1} - 1) + 2^n(1 - 2^p)}{4^p}\right] = 2^{n-p}$$

On going from subrange (p) to the higher subrange (p+1), the lefthand part of the code word must increase by $2^{n-p}$ since:

$$y(p+1) - y(p) = 2^{n-p}(2^{p+1} - 1) - 2^{n-p+1}$$
$$(2^p - 1) = 2^{n-p}$$

Thus it is possible to go from one subrange to another simply by quadrupling the division ratio only after reaching the lower threshold of the higher subrange.

As the lower threshold of the first subrange corresponds to the number 0, it is possible to obtain a code word using a binary counter driven by counting pulses representing the number to be coded through the intermediary of a binary divider with multiple ratios correctly synchronized and with the ratio changed at the start of each subrange, that is to say each time that x crosses one of the threshold values:

$$2^n(2^i - 1) \text{ with } 0 < i \leq p$$

The above equations also lead to another way of finding the number corresponding to a code word, on the condition of assuming that this number is that x' which renders the expression $x(p) + 2^n$ divisible by $4^p$. Equation (3) can then be rewritten in the form:

$$x'(p) = 4^p z[x(p)] + 2^n(2^p - 1)$$

which, given equation (2), may be written:

$$x'(p) = 4^p z[x(p)] + y(p) 2^{p-1}$$

Thus it is possible to decode a code word by identifying the number p of bits in its lefthand part and adding to it the number made up of the lefthand part of the code word shifted by p−1 digits to the left with the number consisting of the righthand part of the code word shifted by 2p digits to the left.

FIG. 1 shows a circuit for implementing the coding method functioning by counting and providing a code word on eight digits.

The figure shows:
a divider circuit 10 with a plurality of division ratios operating on counting pulses forming the number to be coded available at an input 1 with the correct division ratio in each coding subrange,
a synchronisation and selector circuit 20 for the division ratio of the divider circuit 10 identifying the numbers of pulses corresponding to the lower thresholds of the subranges and choosing the appropriate division ratio, and
a counting circuit proper 30 delivering the code word by counting the pulses reaching it from the divider circuit 10.

As the code word comprises eight bits in total, the number p of bits of the sequence of 1 digits constituting the lefthand part of the code word may vary from 0 through 8, which corresponds to nine coding subranges, in fact eight since the last is not limited and is in fact merely an overshoot indication. For the number x to be coded, each of these eight coding subranges corresponds to the domain $$2^7(2^i-1) \leq x < 2^7(2^{i+1}-1)$$

with $0 \leq i \leq 7$
and requires a division ratio of $4^i$, the ninth subrange being reached for $$x \geq 2^7(2^{7+1}-1).$$

The divider circuit 10 comprises a first binary counter/divider 11 certain parallel outputs of which are connected to a selector 12 which drives the counting circuit 30 and is addressed by the synchronization and selector circuit 20.

The first binary counter/divider 11 has a reset to 0 command input R controlled by the synchronization and selector circuit 20 and is advanced on the falling edges on the pulses reaching it from the general counting input 1, which are the counting pulses of the number to be coded. It has an output Q7, consisting of its output with the weight $2^6$, with a division ratio equal to 2 to the power 7 ($2^7$), used by the synchronization and selector circuit 20 to identify passages of the instantaneous number of counting pulses during counting through the lower thresholds of the subranges and seven outputs Q2, Q4, Q6, Q8 ... Q14, consisting of the outputs of weight $2^1$, $2^3$, $2^5$, $2^7$ ... $2^{13}$, with division ratios corresponding to the powers of 4 from 1 through 7 ($4^1$ through $4^7$).

The one from eight type selector 12 comprises, in addition to its data inputs and output and its addressing inputs, an inhibiting command input Inh for disabling its data output if the coding range is overshot. One of its data inputs is connected to the counting input of the first counter/divider 11, constituting a unity division ratio output corresponding to 4 to the power 0 ($4^0$). Its seven other data inputs are connected to the seven outputs of the first counter/divider 11 having division ratios corresponding to powers of 4 from 1 through 7. These connections are made in such a way that the binary number applied to the addressing inputs of the selector 12 corresponds to the power of 4 of the selected division ratio.

The synchronization and selector circuit 20 comprises a second binary counter/divider 21 with a circuit for initializing it to the 1 state, determining by the state of its outputs the coding subrange in which is situated the instantaneous number of the counting pulses being counted, a priority encoder 22 connected to the outputs of the second binary counter/divider 21, determining the rank number of said subrange and controlling the selector 12 of the divider circuit 10, and a circuit for resetting to 0 the first binary counter/divider 11 on alternate changes of subrange and at the start of counting.

The second binary counter/divider 21 has nine consecutive stages with parallel outputs, the first of which is not used, and a reset to 0 command input connected to a general reset to 0 input 2. It is advanced on the falling edges of the pulses applied to its counting input, which reach it through the intermediary of an exclusive-OR type gate 23 either from the initialization to 1 circuit or from the output Q7 of the first binary counter/divider 11 the division ratio of which is 2 to the power 7. The single pulse emitted by the initialization to 1 circuit at the beginning of reception of any sequence of counting pulses and the pulses generated by the first binary counter/divider 11 every $2^7$ packets of counting pulses enable it to make the correspondence between each first passage to logic 1 of one of its outputs of weight $2^j$ ($0 \leq j \leq 8$) and the effective counting of $2^7(2^j-1)$ counting pulses, that is to say the detection of the number to code value identifying the lower threshold of the coding subrange of rank j. The output of weight $2^0$ is not used as it corresponds to the first coding subrange employed at the beginning of reception of a sequence of counting pulses. The highest weight output corresponding to the last, unlimited subrange (j=8) is used to detect overshooting of the entire coding range and serves to inhibit the data output of the selector 12 to prevent the counting circuit 30 being reset to 0 when the capacity is exceeded.

The priority encoder 22 connected to the remaining outputs of the second binary counter/divider 21 delivers on its outputs controlling addressing of the selector 12 a binary number corresponding to the weight of the highest digit position of the outputs of the second binary counter/divider 21 that has taken the value 1, that is to say to the power of 4 of the division ratio of the subrange currently being used.

The reset to 0 circuit synchronizes the first binary counter/divider 11 so that it starts the first interval of each subrange correctly. Failing any resynchronization of the first binary counter/divider 11 during the reception of any sequence of counting pulses, this counter/divider, which is always reinitialized to 0 before reception of each sequence of counting pulses, would begin correctly the first interval of each subrange of rank i of which the lower threshold, $2^n(2^i-1)$, that it would display on starting the subrange, is divisible by the division ratio $4^i$ of that subrange, that is to say of each subrange for which the rank i is less than or equal to n/2, that is in this instance (where n has the value 7) the rank i of which is less than or equal to 3, and would be desynchronized, where necessary, on going to the first subrange the rank i of which is greater than or equal to n/2, that is to say in this instance of which the rank i is equal to 4.

To avoid any such desynchronization it is generally sufficient to reset to 0 the first binary counter/divider 11 on each change of subrange; in the case under consideration where n has the value 7, it is sufficient to apply this resetting to 0 only on alternate changes of subrange beginning with the change from the subrange of rank 0 to the subrange of rank 1. The binary counter/divider 11 then begins correctly the first interval of the subrange of rank 0 and of the subranges with odd rank i equal to $2u+1$ ($0 \leq u \leq 3$); it can easily be seen that the same applies for the other subranges, that is to say for the subranges of even rank $2u+2$ with u less than or equal to 2, because when a subrange of rank $2u+2$ is begun, it then displays the value $2^7+2u+1$ which, since is less than or equal to 2, is divisible by the division ratio $4^{2u+2}$ of this subrange.

The change of subrange is detected from the changes of values of the lowest weight output of the priority encoder 22 and the reset to 0 circuit operates on positive transitions at the lowest weight output of the priority encoder 22. To this end it comprises a differentiator circuit with series capacitor 24 and parallel resistor 25 connecting its input to the lowest weight output of the priority encoder 22 and a pulse shaping circuit comprising an exclusive-OR type logic gate 26 which is placed at the reset to 0 input of the first binary counter/divider 11 with one input grounded and the other connected to the output of the differentiator circuit.

The reset to 0 circuit also comprises two diodes 27 and 28 having their cathode connected to the output of the differentiator circuit and constituting with the resistor 25 of the latter a wired OR type logic gate. The diode 21 has its anode connected to the output of the last stage of the binary counter/divider 21 and holds the first binary counter/divider 11 at 0 in the event of a range overshoot. The other diode 28 has its anode connected to the general reset to 0 input 2 and serves to reinitialize the first binary counter/divider 11 before reception of each sequence of counting pulses.

The conventional design initialization to 1 circuit comprises two-stage shift register 29 clocked by the counting pulses available at the general counting input 1, reset to 0 by instructions received from the general reset to 0 input 2 and receiving on its serial data input a constant logic 1, together with an exclusive-OR type logic gate 19 the inputs of which are connected to the outputs of the two stages of the shift register 29 and the output of which constitutes that of the initialization to 1 circuit.

The counting circuit 30 comprises a third binary counter/divider 31 with eight consecutive stages with parallel outputs and a reset to 0 command input R connected to the general reset to 0 input 2, advancing on falling edges of pulses applied to its counting input by the divider circuit 10, and a bank of buffer registers 32 connected to the parallel outputs of the third binary counter/divider 31 with their write function controlled by a loading command input 3 by which loading is commanded after reception of each sequence of counting pulses.

This circuit makes it possible to code on one byte a range of numbers between 0 and $2^{15}-2^7-1$ (32 639) in eight subranges:
- a first subrange from 0 through 127 with an increment of 1 and no coding error,
- a second subrange from 128 through 383 with an increment of 4 and a maximal coding error of 2.3%,
- a third subrange from 384 through 895 with an increment of 16 and a maximal coding error of 3.9%,
- a fourth subrange from 896 through 1 919 with an increment of 64 and a maximal coding error of 7%,
- a fifth subrange from 1 920 through 3 967 with an increment of 256 and a maximal coding error of 13.3%,
- a sixth subrange from 3 968 through 8 063 with increment of 1 024 and a maximal coding error of 25.8%,
- a seventh subrange from 8 084 through 16 255 with an increment of 4 096 and a maximal coding error of 50.8%,
- an eighth subrange from 16 256 through 32 639 with an increment of 16 384 and a maximal coding error of 100.7%, and to indicate any overshooting of this range.

In practically all existing digital transmission links with distributed equipment, an error rate of $10^{-6}$ (which is serious enough when the link is active) results in a number of errors detected per surveillance cycle less than and often very much less than 895, which gives the coding circuit an accuracy of at least 96% when it is used for the transmission of error rates over an active digital link.

Figure 2:
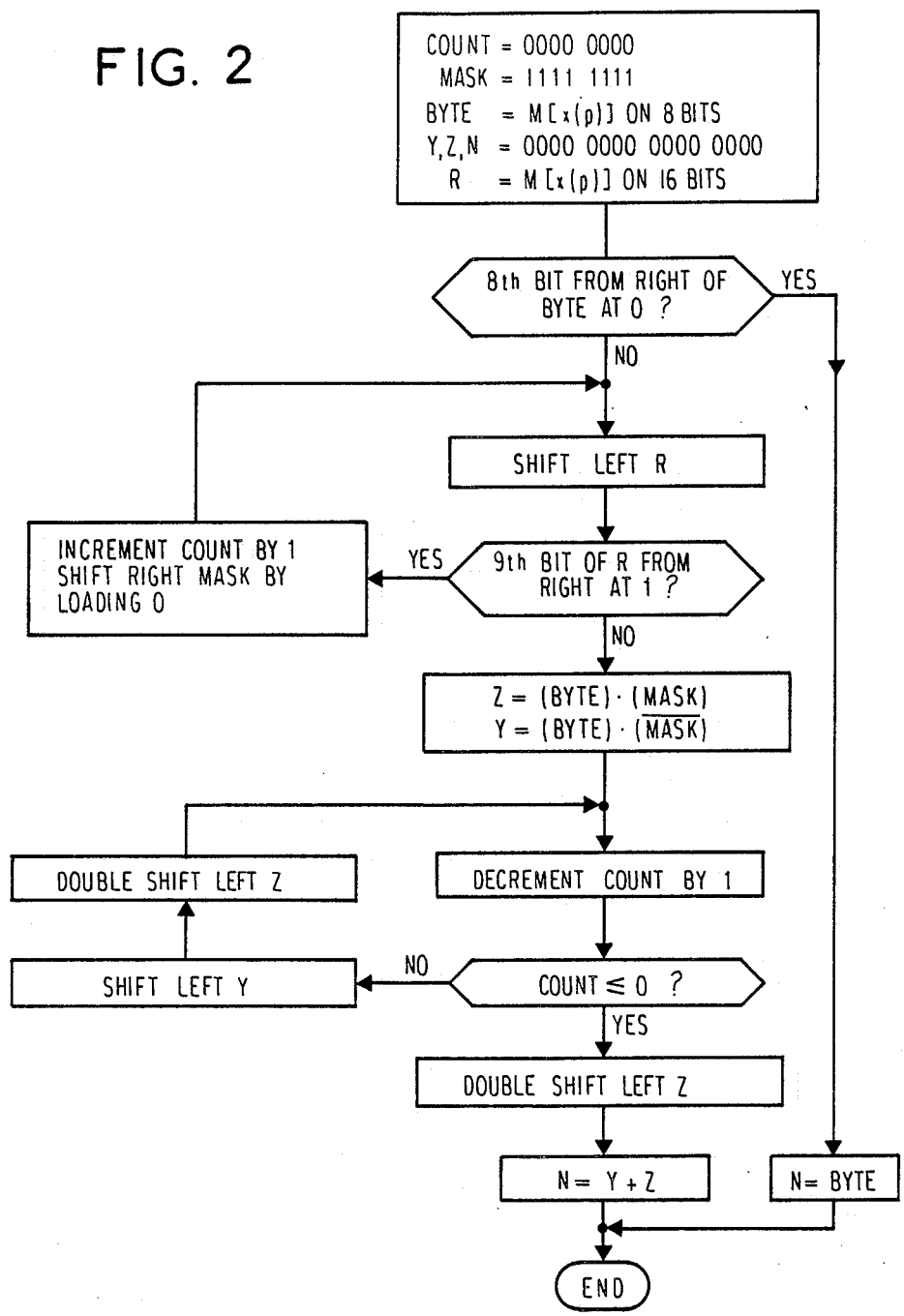
FIG. 2 shows a flowchart for decoding by means of a microprocessor code words coded by the coding method in accordance with the invention.

FIG. 2 shows a flowchart for decoding by a microprocessor of code words on eight digits obtained by the coding method in accordance with the invention.

This flowchart shows, for the determination of the number $x'(p)$ corresponding to a code word $M(x(p))$ with a righthand part $z(x(p))$ and lefthand part $y(p)$, one of these righthand and lefthand parts possibly not existing, the equation:

$$x'(p)=4^p z(x(p))+y(p) 2^{p-1}$$

In this flowchart the function of two variables denoted by a period (.) represents the AND logic function between bits of the same rank in the two variables. The value of the number $x'(p)$ looked for is that of the variable denoted N at the end of execution of the flowchart.

To give an example, the table on the next page gives the values taken by the variables BYTE, MASK, COUNT, R, Y, Z and N featuring in this flowchart when the latter is executed to determine the number $x'(p)$ corresponding to code word 11101000 obtained by coding a number $x(p)$ between 1 408 and 1 471. The value of the the variable N at the end of the calculation, which is the value required, is 10110000000, that is to say 1 408.

| | | |
|---|---|---|
| Initial state | COUNT = | 00000000 |
| | Y = | 0000000000000000 |
| | Z = | 0000000000000000 |
| | N = | 0000000000000000 |
| | MASK = | 11111111 |
| | BYTE = | 11101000 |
| | R = | 0000000011101000 |
| Shift left R | R = | 0000000111010000 |
| Increment COUNT | COUNT = | 00000001 |
| Shift right MASK | MASK = | 01111111 |
| Shift left R | R = | 0000001110100000 |
| Increment COUNT | COUNT = | 00000010 |
| Shift right MASK | MASK = | 00111111 |
| Shift left R | R = | 0000011101000000 |
| Increment COUNT | COUNT = | 00000011 |
| Shift right MASK | MASK = | 00011111 |
| Shift left R | R = | 0000111010000000 |
| Z = (BYTE) . (MASK) | Z = | 0000000000001000 |
| Y = (BYTE) . $\overline{\text{(MASK)}}$ | Y = | 0000000011100000 |
| Decrement COUNT | COUNT = | 00000010 |
| Shift left Y | Y = | 0000000111000000 |
| Double shift left Z | Z = | 0000000000100000 |
| Decrement COUNT | COUNT = | 00000001 |
| Shift left Y | Y = | 0000001110000000 |
| Double shift left Z | Z = | 0000000010000000 |
| Decrement COUNT | COUNT = | 00000000 |
| Double shift left Z | Z = | 0000001000000000 |
| N = Y + Z | N = | 0000010110000000 |

There is claimed:

1. Method of coding numbers in binary form using a pseudo-logarithmic compression law approximated by a curve made up of straight line segments, the method consisting in coding an unsigned number in the form of a code word comprising n+1 binary digits where n is an invariant positive integer, said code word comprising a lefthand part determining the corresponding segment of the compression law curve and a righthand part determining the interval within the segment concerned, in which method:

said lefthand part of the code word is made up of a variable number of binary digits of the same value (hereinafter called 1), the number p corresponding to the rank number of the compression law curve segment concerned as counted from the origin and chosen as equal to the leftward shift, relative to the position of the most significant bit of the code word, of the most significant bit of the number to be coded, expressed in natural binary and augmented by $2^n$, and said righthand part of the code word, when present, is made up of a binary number having at the position of the most significant bit a separator bit the value of which (hereinafter called 0) is the complement of that of said p binary digits of said lefthand part and corresponds to the expression in natural binary of the number to be coded augmented by $2^n$ and then truncated on the right by 2p digits and deprived of its most significant bit.

2. A device for coding in binary form numbers provided in the form of a series of counting pulses using a pseudo-logarithmic compression law approximated by a curve made up of straight line segments by a method consisting in coding an unsigned number in the form of a code word comprising n+1 binary digits where n is an invariant positive integer, said code word comprising a lefthand part determining the corresponding segment of the compression law curve and a righthand part determining the interval within the segment concerned, in which method:

said lefthand part of the code word is made up of a variable number p of binary digits of the same value (hereinafter called 1), the number p corresponding to the rank number of the compression law curve segment concerned as counted from the origin and chosen as equal to the leftward shift, relative to the position of the most significant bit of the code word, of the most significant bit of the number to be coded, expressed in natural binary and augmented by $2^n$, and said righthand part of the code word, when present, is made up of a binary number having at the position of the most significant bit a separator bit the value of which (hereinafter called 0) is the complement of that of said p binary digits of said lefthand part and corresponds to the expression in natural binary of the number to be coded augmented by $2^n$ and then truncated on the right by 2p digits and deprived of its most significant bit, said device comprising:

a divider circuit with a plurality of division ratios operating on said series of counting pulses and having one output corresponding to a division ratio of $2^n$ and another output corresponding to a variable division ratio selected from powers of 4 corresponding to the rank numbers of the segments of the compression law as counted from the origin, the first segment having the rank number 0, a synchronization and selector circuit for determining, by counting packets of $2^n$ counting pulses sent by the divider circuit and by registering when the number of said packets crosses a threshold $2^i - 1$ where i is an integer between 1 and n, when lower thresholds of subranges corresponding to the segments of the compression law curve with rank number i are crossed and for commanding said divider circuit to select a division ratio corresponding to the ith power of 4 and which resynchronizes said divider circuit after a subrange lower threshold has been crossed, and an n+1 stage counter circuit for counting pulses delivered by the variable division ratio output of said divider circuit and for providing a count which gives the value of the code word corresponding to the number of counting pulses applied to said divider circuit, wherein n is an invariant positive integer, said code word comprising a lefthand part determining the corresponding segment of the compression law curve and a righthand part determining the interval within the segment concerned.

3. Device according to claim 2, wherein said divider circuit comprises a binary counter/divider which has a reset to 0 command input controlled by said synchronization and selector circuit, which operates on said counting pulses and which has an output with a division ratio equal to $2^n$ and a series of parallel outputs with separate division ratios equal to powers of 4 corresponding to the rank numbers of the segments of the compression law, and a selector connected to said series of parallel outputs of said first binary counter/divider and controlled by said synchronization and selector circuit.

4. Device according to claim 2, wherein said synchronization and selector circuit comprises:

a binary counter/divider which has an initialization to 1 circuit and a reset to 0 command input and which is initialized to 1 at the beginning of each series of counting pulses and operates on the pulses delivered by the output with division ratio $2^n$ of said divider circuit, which has consecutive stages having parallel outputs except for the first and for which the rank number of the highest weight output that has gone to logic 1 corresponds to the rank number of the segment concerned of the compression law, a priority encoder having inputs connected to the parallel outputs of said binary counter/divider delivering on parallel outputs the rank number of the highest weight output that has gone to logic 1 of said binary counter/divider, which rank number is used as a selection command input for said divider circuit, and a circuit for resetting to 0 said divider circuit operating on the basis of transitions at the lowest weight output of said priority encoder.

5. A device according to claim 2, wherein said lefthand part of said code word is made up of a variable number p of binary digits of the same value (hereinafter called 1), the number p corresponding to the rank number of the compression law curve segment concerned as counted from the origin and chosen as equal to the leftward shift, relative to the position of the most significant bit of the code word, of the most significant bit of the number to be coded, expressed in natural binary and augmented by 2n, and wherein said righthand part of the code word, when present, is made up of a binary number having at the position of the most significant bit a separator bit the value of which (hereinafter called 0) is the complement of that of said p binary digits of said lefthand part and corresponds to the expression in natural binary of the number to be coded augmented by $2^n$ and then truncated on the right by 2p digits and deprived of its most significant bit.

* * * * *